(12) United States Patent
Mather (10) Patent No.: US 9,791,523 B2
(45) Date of Patent: Oct. 17, 2017

(54) MAGNETIC SENSOR UTILIZING MAGNETIZATION RESET FOR SENSE AXIS SELECTION

(71) Applicant: Fairchild Semiconductor Corporation, San Jose, CA (US)

(72) Inventor: Phil Mather, Phoenix, AZ (US)

(73) Assignee: Fairchild Semiconductor Corporation, San Jose, CA (US)

( * ) Notice: Subject to any disclaimer, the term of this patent is extended or adjusted under 35 U.S.C. 154(b) by 309 days.

(21) Appl. No.: 14/218,771

(22) Filed: Mar. 18, 2014

(65) Prior Publication Data

US 2014/0266187 A1 Sep. 18, 2014

Related U.S. Application Data

(60) Provisional application No. 61/793,367, filed on Mar. 15, 2013.

(51) Int. Cl.
G01R 33/02 (2006.01)
G01R 33/09 (2006.01)

(52) U.S. Cl.
CPC ................. *G01R 33/096* (2013.01)

(58) Field of Classification Search
CPC ............................................ H01L 2224/06181
USPC ....................................... 324/252, 200, 244
See application file for complete search history.

(56) References Cited

U.S. PATENT DOCUMENTS

| 4,564,489 | A | * | 1/1986 | Welzen | F27D 5/0012 264/607 |
| 4,611,169 | A | * | 9/1986 | Hermann | G01R 33/02 104/284 |
| 5,255,059 | A | * | 10/1993 | Kai | G03G 15/0818 399/265 |
| 7,126,330 | B2 | | 10/2006 | Peczalski et al. | |

(Continued)

FOREIGN PATENT DOCUMENTS

DE    4314539 A1    11/1994

OTHER PUBLICATIONS

Da Silva, F.C.S., et al., "A Z-Component Magnetoresistive Sensor", Appl. Phys. Lett. 92, 142502 (2008), (Apr. 8, 2008), 3 pgs.

(Continued)

*Primary Examiner* — Giovanni Astacio-Oquendo
(74) *Attorney, Agent, or Firm* — Brake Hughes Bellermann LLP (57) ABSTRACT

This document discusses, among other things, a first magnetic sensor configured to sense first and second components of a magnetic field in respective, orthogonal directions, using first, second, third, and fourth sense elements, each on an angled surface sloped with respect to a surface, each including respective first, second, third, and fourth longitudinal axes, each parallel to each other. Further, a second magnetic sensor on the same surface can sense second and third components of a magnetic field in respective, orthogonal directions, using first, second, third, and fourth sense elements, each on an angled surface sloped with respect to the first surface, each including respective first, second, third, and fourth longitudinal axes, each parallel to each other and orthogonal to the longitudinal axes of the first magnetic sensor.

20 Claims, 6 Drawing Sheets

(56) References Cited

U.S. PATENT DOCUMENTS

| | | | |
|---|---|---|---|
| 7,221,157 B2* | 5/2007 | Wakabayashi | G01D 5/145 |
| | | | 257/E43.007 |
| 7,982,461 B2 | 7/2011 | Aiso | |
| 8,110,119 B2* | 2/2012 | Breuer | G01R 33/0206 |
| | | | 216/22 |
| 8,633,555 B2* | 1/2014 | Shen | G01R 33/098 |
| | | | 257/295 |
| 9,123,876 B2* | 9/2015 | Deak | G01B 7/30 |
| 9,230,564 B2* | 1/2016 | Biskeborn | G11B 5/00821 |
| 2006/0176142 A1* | 8/2006 | Naito | G01R 33/0206 |
| | | | 338/32 R |
| 2008/0169807 A1* | 7/2008 | Naito | B82Y 25/00 |
| | | | 324/252 |
| 2012/0212217 A1* | 8/2012 | Engel | G01R 33/098 |
| | | | 324/252 |
| 2013/0285651 A1* | 10/2013 | Wan | H01L 27/22 |
| | | | 324/249 |
| 2013/0298669 A1* | 11/2013 | Ausserlechner | G01R 33/093 |
| | | | 73/504.01 |
| 2013/0300402 A1* | 11/2013 | Liu | G01R 33/09 |
| | | | 324/202 |
| 2014/0021571 A1* | 1/2014 | Lei | G01B 7/30 |
| | | | 257/427 |

OTHER PUBLICATIONS

Ettelt, Dirk, "Conception and fabrication of a strain-gauge magnetometer", A thesis submitted in partial satisfaction of the requirements for the degree of Doctor of Philosophy in Nano Electronics and Nano Technologies at the University of Grenoble, (Apr. 14, 2012), 26 pgs.

* cited by examiner

MAGNETIC SENSOR UTILIZING MAGNETIZATION RESET FOR SENSE AXIS SELECTION

CLAIM OF PRIORITY

This application claims the benefit of priority under 35 U.S.C. §119(e) of U.S. Provisional Patent Application Ser. No. 61/793,367, titled "MAGNETIC SENSOR UTILIZING MAGNETIZATION RESET FOR SENSE AXIS SELECTION," filed on Mar. 15, 2013, which is incorporated by reference herein in its entirety.

BACKGROUND

Magnetoresistance refers to property of a material to change its resistivity in the presence of a magnetic field. Magnetic sensors can utilize magnetoresistance to sense various components of magnetic fields. For example, magnetic sensor units can be arranged to sense a component of a magnetic fields in specific directions.

For example, U.S. Pat. No. 7,126,330 describes a three-dimensional magnetic sensing device configured to sense three mutually orthogonal components of a magnetic field using three separate sensor units, including first and second magnetic sensor units formed on a common plane on a single substrate to sense x- and y-axis components and a third magnetic sensor formed on a sloped surface with respect to the common plane to sense a z-axis component.

OVERVIEW

This document discusses, among other things, a first magnetic sensor configured to sense first and second components of a magnetic field in respective, orthogonal directions, using first, second, third, and fourth sense elements, each on an angled surface sloped with respect to a surface, each including respective first, second, third, and fourth longitudinal axes, each parallel to each other. Further, a second magnetic sensor on the same surface can sense second and third components of a magnetic field in respective, orthogonal directions, using first, second, third, and fourth sense elements, each on an angled surface sloped with respect to the first surface, each including respective first, second, third, and fourth longitudinal axes, each parallel to each other and orthogonal to the longitudinal axes of the first magnetic sensor.

This overview is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

The present inventor has recognized, among other things, a magnetic sensor utilizing magnetization reset for sense axis selection. In an example, the magnetic sensor can comprise one or more sense elements configured in a half- or full-Wheatstone bridge configuration, configured to sense, among other things, one or more components of a magnetic field in one or more specified directions. Combined, the magnetic sensor disclosed herein can include a single full-Wheatstone bridge configured to sense first and second components of a magnetic field in two orthogonal directions.

Figure 1:
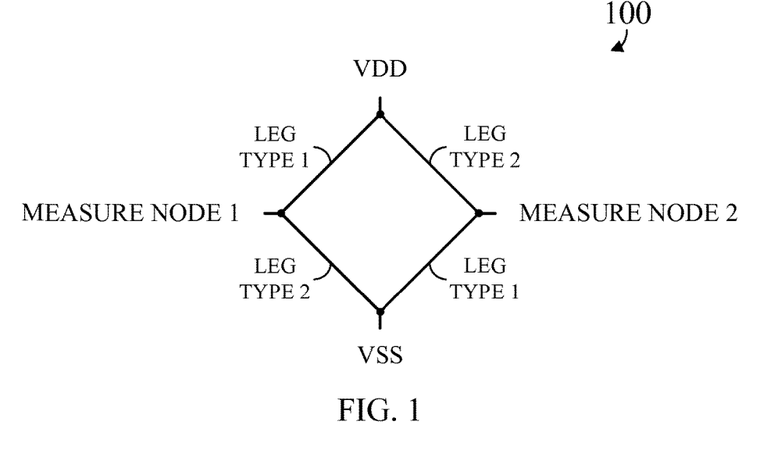
FIG. 1 illustrates generally an example electrical schematic of a full-Wheatstone bridge.

FIG. 1 illustrates generally an example electrical schematic of a full-Wheatstone bridge 100 configured to measure a change in resistivity due, for example, to an applied magnetic field. The example of FIG. 1 illustrates generally a full-Wheatstone bridge having two leg types, leg type 1 and leg type 2. Each leg can consist of a single sense element or can include an array of sense elements.

Figure 2:
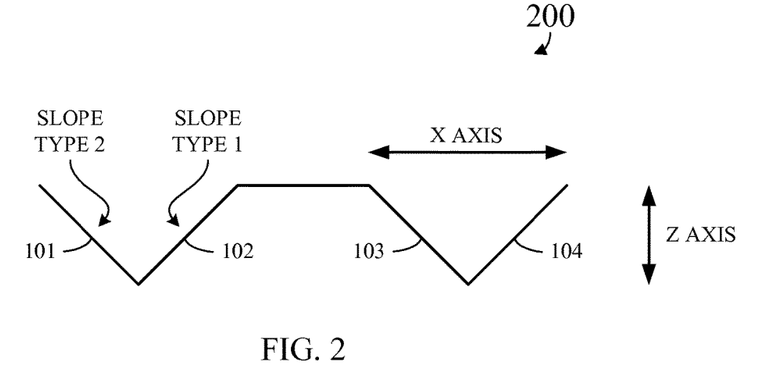
FIG. 2 illustrates generally a side view of a substrate having one or more angled surfaces.

FIG. 2 illustrates generally a side view of a substrate 200 having one or more angled surfaces, including, for example, first, second, third, and fourth angled surfaces 101, 102, 103, 104. Each angled surface has a slope (e.g., slope type 1, slope type 2, etc.) determined, in certain examples, using one or more etching or other processes. One or more angled surfaces, such as one or more of those disclosed in FIG. 2, can be used to form one or more legs of a half- or full-Wheatstone bridge. In FIG. 2, the x- and y-axes are illustrated, whereas the y-axis goes into and out of the page.

In an example, at least two Wheatstone bridge legs can include a ferromagnetic material, such as a nickel-iron alloy (NiFe), deposited over at least a portion of one or more of the angled surfaces, for example, ~1 to 30 um wide strips having an aspect ratio of at least 3, and 40 to 1000 angstroms (A) thick. The ferromagnetic material can be doped to enhance anisotropic magnetoresitance (AMR) of the material or lower its magnetic moment (e.g., using copper (Cu), molybdenum (Mo), or one or more other doping). The at least two bridge legs can form a half-Wheatstone bridge or a portion of a full-Wheatstone bridge.

In an example, the angled surfaces can be etched with potassium hydroxide (KOH), heated tetramethylammonium Hydroxide (TMAH), ethylenediamine pyrocatechol (EDP), or one or more similar processes to form a 54.7 degree angle from the substrate surface, etched with deep reactive-ion etching (RIE) to form a 45 degree side angle from the substrate surface followed by a subsequent step to create a smooth surface. If an exposed silicon (Si) surface is produced, an oxide can be grown or deposited to isolate one or more ferromagnetic members from one another. Alternatively, the sloped surface can be formed from deposition of a thick dielectric material that can be etched to form horizontal bars upon the substrate and either a dielectric reflow process, angled etch, or other sidewall spacer process can be applied to produce sloped surfaces elevated above the substrate. Sets of grooves can be formed with orthogonal in-plane directions to one another, orienting the two half- or full-Wheatstone bridges 90 degrees from one another upon device completion. Growth of a dielectric can be advantageous in that buried conductive lines can be formed both underneath and above the ferromagnetic material to apply fields in various orientations, for example, along a long axis of the ferromagnetic element to reverse local magnetization (e.g., to switch between measurement axes or to perform a set/reset measurement) or along the ferromagnetic element short axis to function as an electrical self test.

Figure 3:
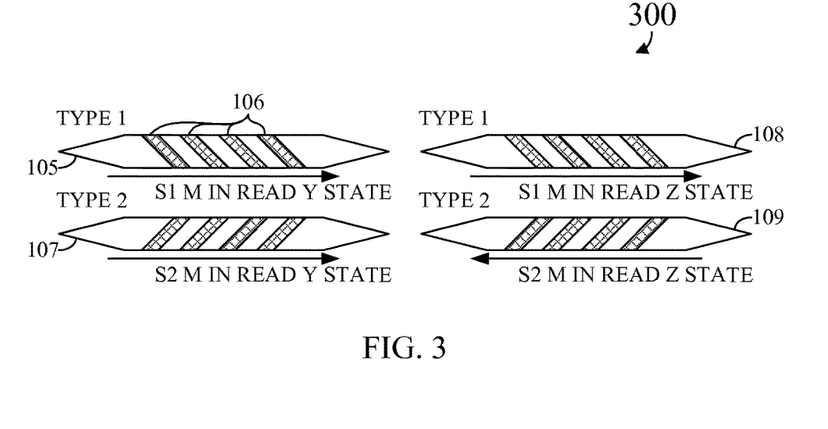
FIG. 3 illustrates generally an example top down arrangement of ferromagnetic sense elements.
Figure 4:
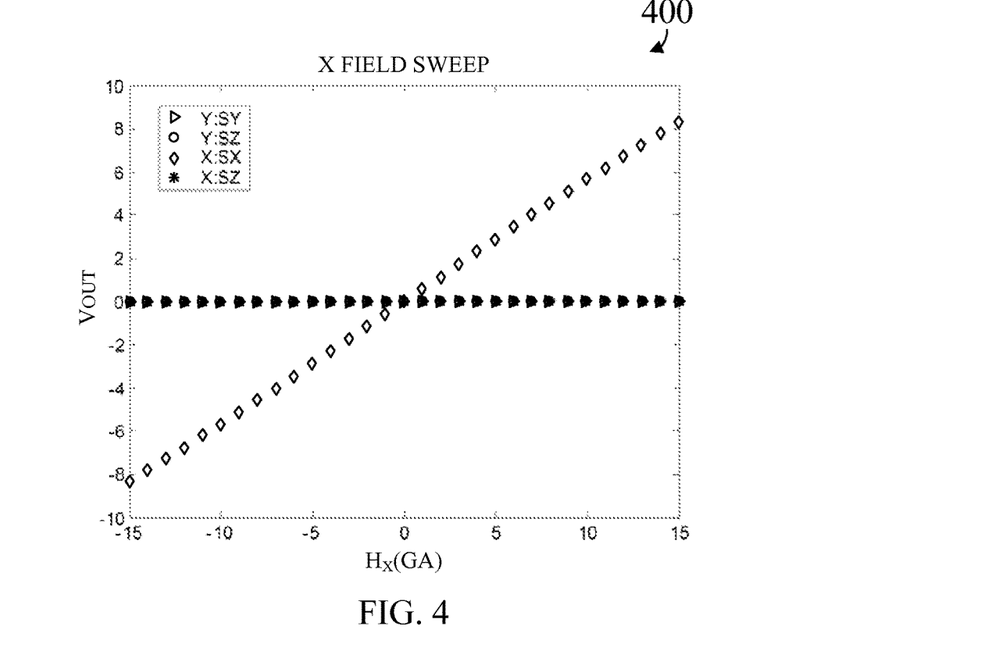
FIGS. 4-7 illustrate generally magnetic reconfiguration and resultant bridge output simulations for two full-Wheatstone bridges.
Figure 5:
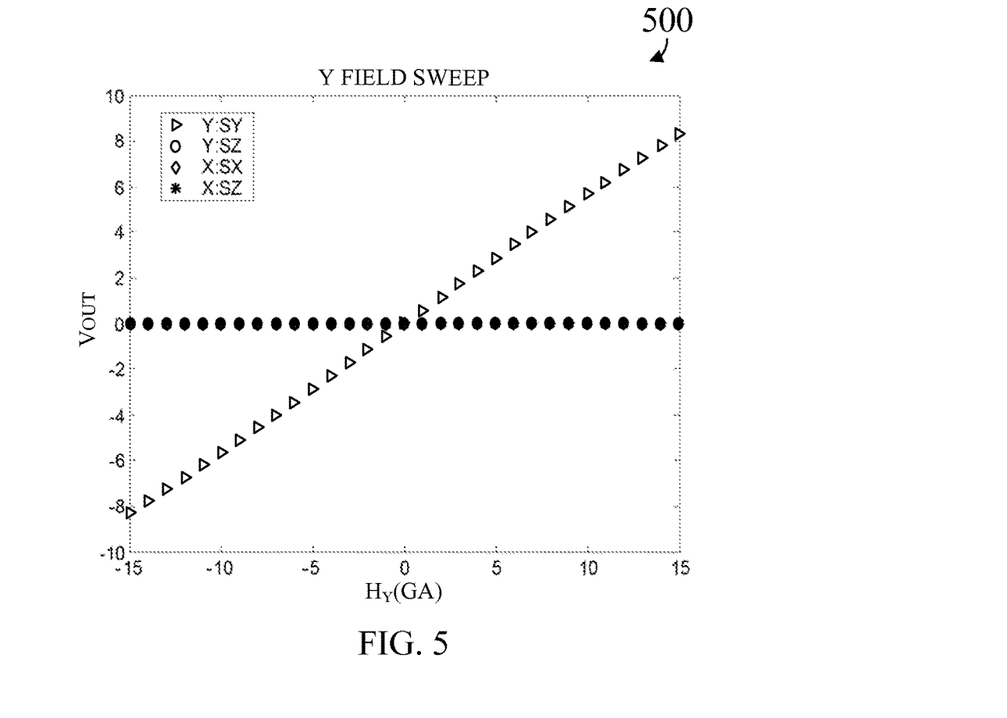
Figure 6:
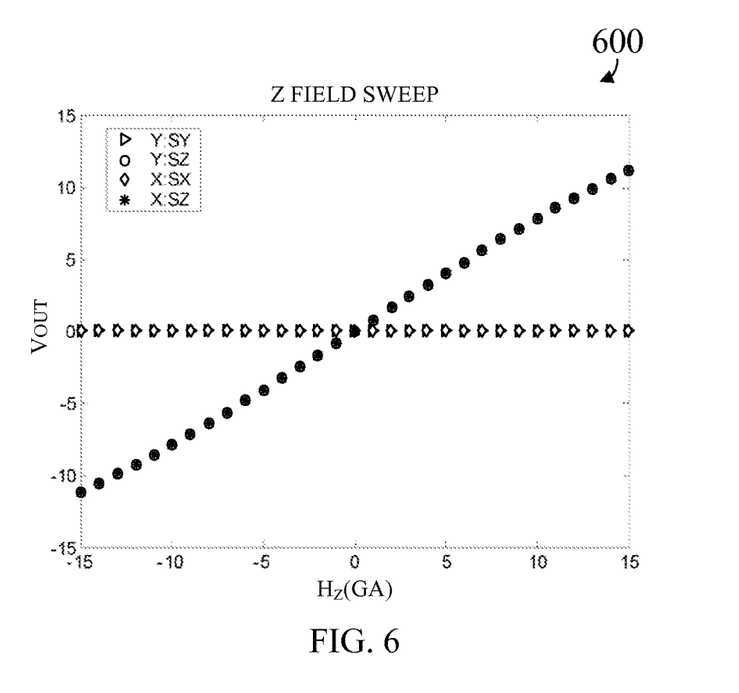
Figure 7:
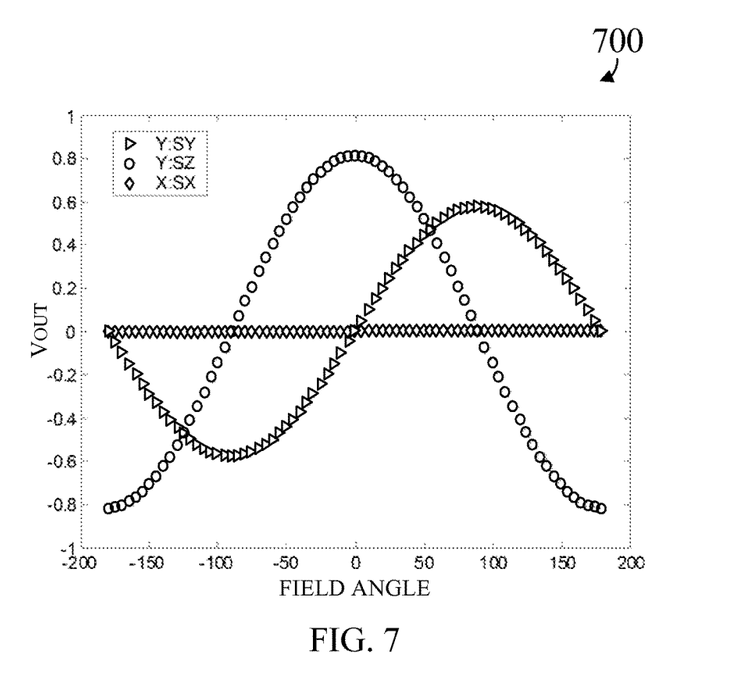

FIG. 3 illustrates generally an example top down arrangement 300 of first, second, third, and fourth ferromagnetic sense elements 105, 107, 108, 109 formed on angled surfaces, such as illustrated in FIG. 2. Each sense element in FIG. 3 includes one or more bias elements, illustrated on the first sense element 105 as bias elements 106. In an example, between one and four bridge legs can be formed using the four sense elements illustrated here. Each sense element can form a separate bridge leg, or more than one sense element can be combined to form a single bridge leg. Accordingly, used separately, the four sense elements of FIG. 3 can be used to form two half-Wheatstone bridges or one full-Wheatstone bridge. Used in combination, the four sense elements of FIG. 3 can be used to form as little as a portion of a single leg of a half- or full-Wheatstone bridge.

In an example, the bias elements 106 can be configured as barber-pole-bias shunting bars formed from aluminum (Al), Cu, or one or more other high conductivity materials deposited either above or below the sense elements to cause current to flow a desired angle away from the magnetization direction (e.g., ±45 degrees) to linearize the sensor resistance response. In an example, the bias elements can be deposited on a diffusion barrier on the sense elements.

In a Wheatstone bridge, the bias elements can be formed on different sense elements at different angles (e.g., 90 degrees apart) so that when magnetization is deflected from the long axis of the sense element, one element increases in resistance while another element decreases in resistance. Since the two half bridges lie along a sloped surface, they can provide response that can be related to X, Y, and Z fields in a plane. For example, a single leg formed on an angled sidewall will have a resistance response that is dependent upon pre-factors (a, b), where (a) times the X-field component plus (b) times the Z-field component (with Z field related response stronger for 100 Si etched via KOH or TMAH due to the 54.7 degree orientation). For a type 1 sense element, illustrated in the example of FIG. 3, the response can be approximated as $R1=R0(1+(aX+bZ))$, where X and Z represent the field components in the X and Z directions. For other angles and orientations, the (a) and (b) factors may have different weights. A sense element lying on the same sidewall, but with a 90 degree change in the bias angle will have $R2=R0(1-(aX+bZ))$. As the AMR effect has a 180 degree symmetry, the above relation $R2=R0(1-(aX+bZ))$ may also be arrived at with an identical barber pole bias angle and reversing the magnetization of the first sense element via a field pulse in a proximal reset line, illustrated in FIGS. 12 and 13.

In an example, reset lines can be Al or Cu wire that either encircle or run above or below a sense element, routed to provide a field along the long axis of the sense element. Sense elements made of the same ferromagnetic material deposited on an opposing sidewall can produce signals such as $R3=R0(1-aX+bZ)$ and $R4=R0(1+aX-bZ)$, depending upon relative alignment between current flow, barber pole bias angle, and magnetization orientation. Therefore, the magnetic field component directed along a single axis can be determined by arranging a number of sense elements in a half- or full-Wheatstone bridge configuration.

To save space and chip cost, a dynamically adjustable method can be employed wherein a reset line is parsed to allow independent switching of the local magnetization of sense elements of each type. In such a case, a first reading can be taken with type 1 sense elements in the R1 response state and type 2 sense elements held in the R2 response state, yielding output proportional to the X-field component. Subsequently, a reversal pulse can be applied to, for example, the type 2 sense elements within the Wheatstone bridge. Another set of readings can then be taken, but now, since the type 2 sense elements are in the R4 response state, the Wheatstone bridge output will be proportional to the Z-field component. This reversed configuration (e.g., one sense element type in one configuration, the other along the opposing magnetization direction) can provide Z-axis output only, eliminating the need for a third physical bridge or algebraic decomposition, such as required by alternative technologies. Therefore, only two bridges are required to get all three components of the field for a more efficient use of die area. A second bridge can be oriented orthogonally in-plane and provides Y and Z signals, if a second set of Z-axis signals is desired.

As illustrated in the example of FIG. 3, a single structure can determine both Y and Z response, simply one pair of bridge legs is magnetically reversed between states. Flipping techniques provide highly accurate coronal diagnostic spectrometer (CDS) measurements by measuring Y1, then reversing both magnetization directions and measuring Y2. In other examples, electrical reversal of the current flow may work as well. Further, an orthogonal orientation can provide X and Z signals. Multiplexing between different leg electrical interconnections can provide another route for signal enhancement, as can dithering the relative barber pole bias, side wall slope, or magnetization orientation. For example, all barber pole bias could be the same, bridges formed on the same side wall, and then signals arise from differing magnetization orientations in sense elements.

FIGS. 4-7 illustrate generally magnetic reconfiguration and resultant bridge output simulations 400, 500, 600, 700 for two full-Wheatstone bridges as described in FIG. 3 (e.g., X/Z bridge in read X, Z states and Y/Z bridge in read Y, Z states).

Figure 8:
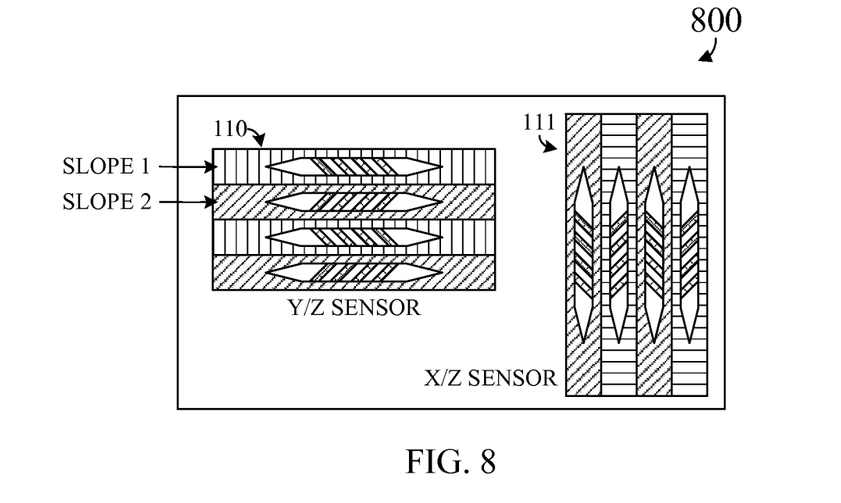
FIGS. 8 and 9 illustrate generally two example chip layouts.
Figure 9:
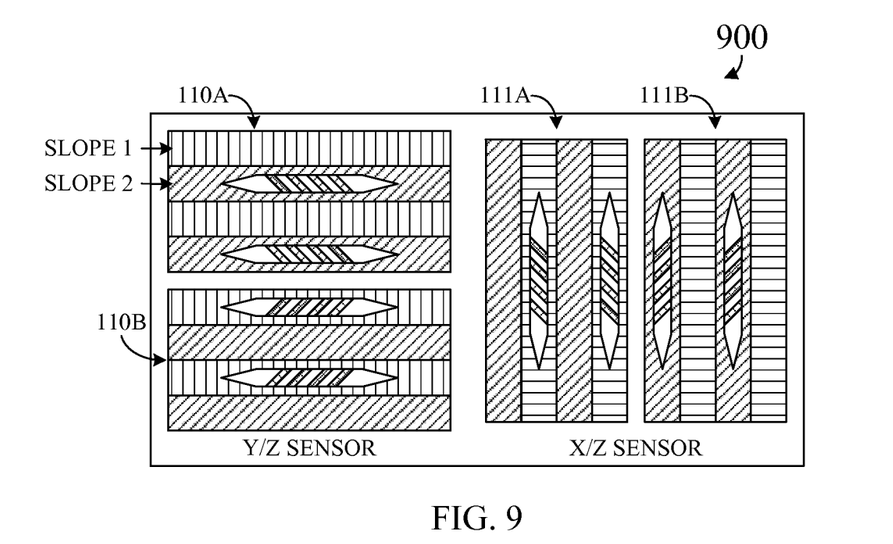

FIGS. 8 and 9 illustrate generally two example chip layouts 800, 900 for the configurations discussed above with respect to FIG. 3. FIG. 8 includes a Y/Z sensor 110 and an X/Z sensor 111 having sense elements on successive angled surfaces, illustrated as patterns slope 1 and slope 2. FIG. 9 includes first and second Y/Z sensors 110A, 110B and first and second X/Z sensors 111A, 111B having sense elements on alternating angled surfaces. The sensors can be grouped together or distributed across the chip, depending on, for example, constraints of reset routing, etc. In an example, the X axis in FIGS. 8 and 9 include the side perimeters of the figure, while the Y axis includes the top and bottom perimeters of the figure, and the Z axis extends into and out of the figure.

Figure 10:
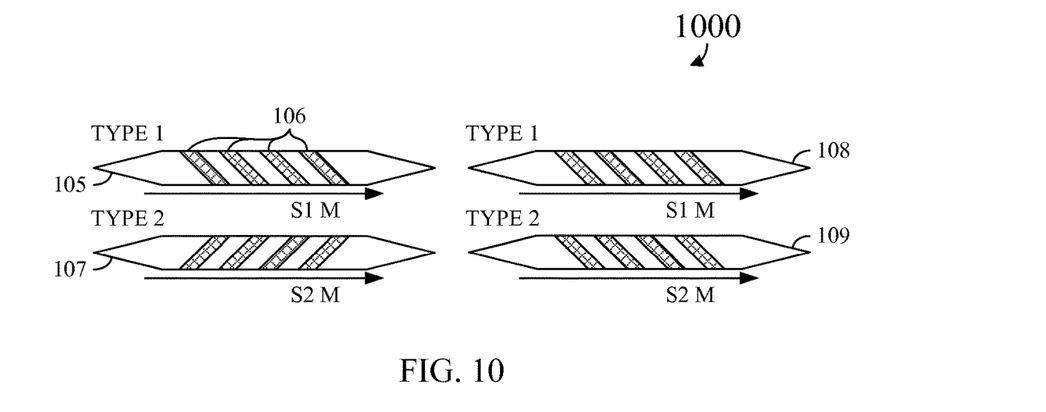
FIG. 10 illustrates generally an example top down arrangement of ferromagnetic sense elements formed on angled surfaces.

FIG. 10 illustrates generally an example top down arrangement 1000 of first, second, third, and fourth ferromagnetic sense elements 105, 107, 108, 109 formed on angled surfaces, such as illustrated in FIG. 2. Each sense element in FIG. 10 includes one or more bias elements, illustrated on the first sense element 105 as bias elements 106.

In contrast to that illustrated in FIG. 3, the number of reorientations required between measurements can be reduced using a passive subtraction method. In this example, a single chip, three axis magnetic sensor is built from sense elements (or arrays thereof) built on sloped sidewalls orientated at 90 degrees to one another, where each bridge gives a response to a fixed magnetic field component along a single axis. This can be implemented by constructing a first sensor from elements of type 1 and type 2 utilizing barber pole bias and magnetization combinations to produce R1 and R3 type dependencies to pull out the X component of the field and a second sensor from elements of type 1 and 2, where R1 and R4 type relations are used to pull out the Z component of the field. A full reversal of the magnetizations of each sense element of such a bridge can produce a signal dependent upon −X or −Z field, and allow offset subtraction through sample and hold circuitry. Another bridge can be built in groove oriented 90 degrees to those bridges producing previous X and Z signals, to provide response proportional to a field component in the Y direction.

The extra information gathered from the Z signal from the second bridge can be used to compensate for cross-axis effects and extend the linear range (e.g., utilizing digital signal processing (DSP) on an application-specific integrated circuit (ASIC) chip, which can be integrated into a magnetometer chip). Because cross-axis effects arise from an additional stiffening field along the long axis of the sense element, the two bridges oriented at 90 degrees in-plane from one another will experience a different field along their non responsive axes, and this will directly impact the signal measured on the Z-axis response of the two bridges in the system, which will be identical in the absence of any cross-axis field. If differing signals are measured from the Z-field measurement on the first and second bridges, additional information about in-plane field components can be utilized to reduce the iterative calculation otherwise required to back out the true field. The cross-axes effect can be understood as an additional spring constant that diminishes the response of the orthogonal sense axis. An X field can reduce the sensitivity of a Y sensor by about 1% Gauss, and can also reduce the Z response of that same sensor by about 1% when configured to measure a Z field. The X sensor would see the Z component unchanged, so comparison of these two values allows additional data to be taken to further compensate such non-linear effects.

Figure 11:
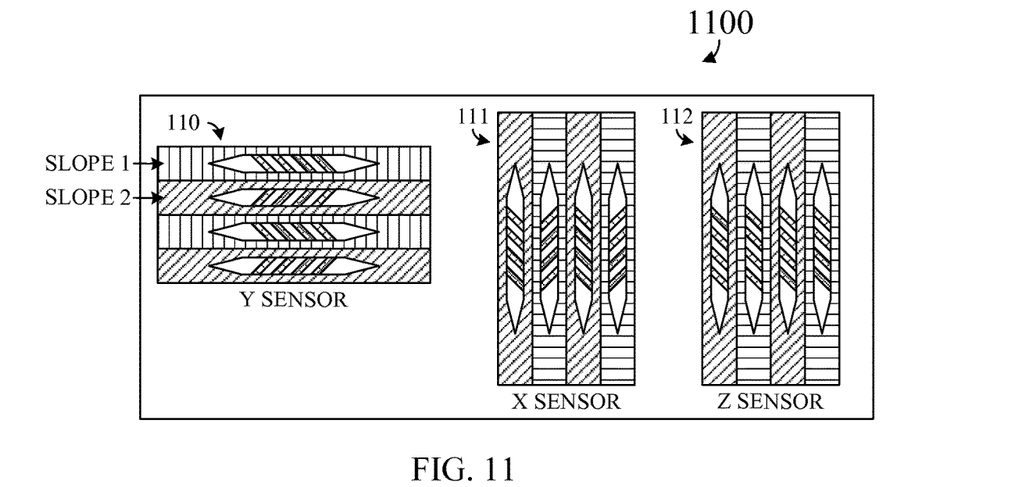
FIG. 11 illustrates generally an example chip layout.

FIG. 11 illustrates generally an example chip layout 1100 for the configurations discussed above with respect to FIG. 10. The chip layout 1100 includes a Y sensor 110, an X sensor 111, and a Z sensor 112, each having sense elements on successive angled surfaces, illustrated as patterns slope 1 and slope 2. Note that, in the example illustrated in FIGS. 10 and 11, no additional signal processing is required, as the bridges directly provide output that is proportional to X, Y, Z fields and aligned with the chip edge and surface normal. For generality, each magnetic sense element may be replaced with an array of sense elements for signal-to-noise enhancements and connected together in either a series combination, parallel combination, or combination thereof. The bridge legs formed from the sense elements can be interdigitated so that the two or four legs, while electrically connected in blocks through the interconnection path, are interspersed in physical layout so as to reduce the effects of die stress and temperature variances on the total sensor output. This is achieved as the die level stress shifts are distributed equally across all bridge legs without a discrete physical block of sense elements comprising each bridge leg separated across the chip. Each individual sense element magnetostriction induced response is averaged out in the same manner for each of the sensor bridge legs and all legs are equally affected by a die level stress profiles.

Figure 12:
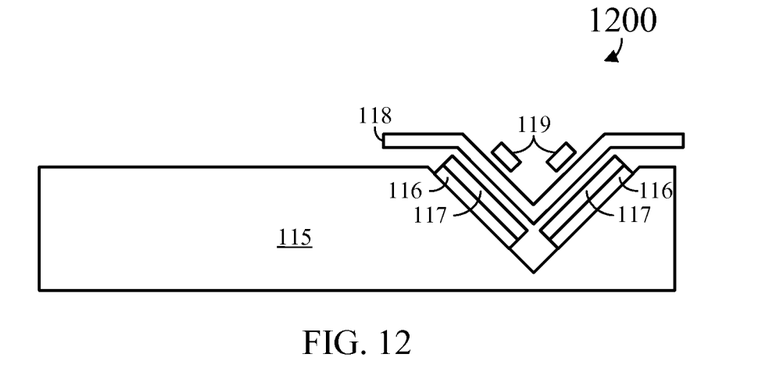
FIG. 12 illustrates generally an example device cross section etched into a substrate.

FIG. 12 illustrates generally an example device cross section 1200 etched into a substrate 115, including a ferromagnetic layer 116 (e.g., a ferromagnetic sense element), an Al barber pole bias 117 (e.g., bias element), a reset line 118, and self-test lines 119. The space between the numbered layers can include a dielectric layer.

Figure 13:
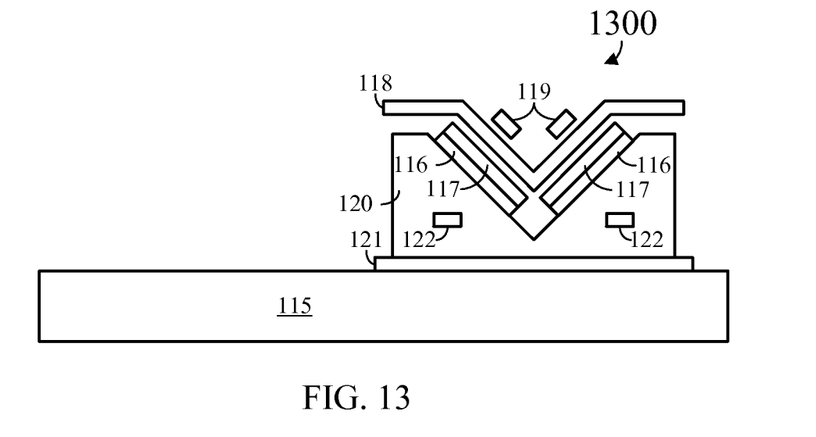
FIG. 13 illustrates generally an example device cross section formed using a dielectric deposition process.

FIG. 13 illustrates generally an example device cross section 1300 formed using a dielectric deposition process. The device cross section 1300 includes one or more channels formed in a dielectric 120, and includes a substrate 115, a ferromagnetic layer 116 (e.g., a ferromagnetic sense element), an Al barber pole bias 117 (e.g., bias element), a reset line 118, self-test lines 119, 122, and a reset line 121. The space between the numbered layers can include a dielectric layer. The example cross section illustrated in FIG. 13 allows a denser device structure than that illustrated in FIG. 12.

The above invention can be formed in an integrated die having underlying CMOS circuitry, providing a variety of signal conditioning functionality, such as first stage amplification of output signals, analog-to-digital conversion, electrostatic discharge (ESD) protection, reset timing and distribution, or a variety of other logic and signal compensation functions.

Further, the present inventor has recognized, among other things, a single chip, 3-axis sensor with DSP compensation to map sensor-defined axes into chip-defined axes. In an example, a 3-axis magneto-resistive-based system (e.g., AMR, giant magnetoresistance (GMR), or tunnel magnetoresistance (TMR), formed of a half- or full-Wheatstone bridge, etc.) can be built on at least first and second angled sidewalls of a first trench formed from anisotropic etch or other method in or on a substrate surface. A third axis can be formed on either the substrate surface or the angled sidewall of a second trench formed at an approximately orthogonal angle to the first trench. All bridge legs of a given axis can be built on the same sloped sidewall.

In an example structure, the legs of a single-axis sensor can be formed on, for example, the left sidewall of a series of at least two trenches (e.g., four for a full-Wheatstone bridge), the trenches formed from two angled planes etched or otherwise formed in or on a substrate, while the orthogonal axis legs can be be formed on the other (e.g., right in this case) sidewall. Interconnect wiring will traverse the edges of the sloped structure, electrically coupling the individual bridge legs formed on each sidewall together in a half- or full-Wheatstone bridge.

For the purposes of signal to noise improvements, multiple strips (e.g., magneto-resistive material deposited upon the sidewall slopes) can be electrically coupled in series, parallel, or some combination thereof. An array of such electrically connected strips can then make up an individual bridge leg. While the two sidewall slopes may not be exactly orthogonal, depending upon the trench formation method (e.g., 109.4 degrees in the case of a KOH anisotropic etch), if the angle is well known and consistent from the fabrication process, the angle may be corrected for in a hardcorrection algorithm applied to resulting sensor signals. In an example, sensor response axes can be remapped onto a chip normal to various edges using signal processing (e.g., on an ASIC).

Variances around the fabrication angle can be further accounted for utilizing measurements taken during final test. A third axis with a projection onto a mutually orthogonal axis from the two previously defined sense axes can lie either on the plane of the substrate or on the side walls of a trench formed in the substrate that is orthogonal to the first trench formed in the substrate. Hence, a three-axis sensing system can be built, signals from which can be normalized to be mutually orthogonal through post-signal processing. Furthermore, the system can be over-determined by utilizing both angled sidewalls of the second trench, and therefore signals can be combined and processed from four or more axes to improve accuracy.

The above can be formed in an integrated die having underlying CMOS circuitry, providing a variety of signal conditioning functionality including reset drivers, ESD protection, signal conditioning, or even full ASIC functionality providing compensated digital output signals to a host microcontroller. Hence, an inexpensive, hardware-DSP-compensated three-axis magnetic sensing system can be realized.

In other examples, a reset line can be formed integral to an AMR device either as a series of planar coils or a number of coil segments that enclose the short axis of the ferromagnetic sense elements from above and below. The sense elements can be reset sequentially or co-temporally. The magnetization can be reversed on two of the bridge legs, in lieu of or in addition to differing barber pole bias directions, affording an additional degree of symmetry for offset cancelation. The symmetries thus exploited for multiple measurements of the sensor for minimal offset and temperature effects are: barber pole bias angle; magnetization direction (e.g., pairs of legs within a bridge in different orientations); current flow direction; and complete reversal of the magnetization direction of all the sense elements in a given bridge. These may be controlled via on-chip or off-chip circuitry, and multiple measurements can be added, averaged, or subtracted from one another, depending upon the symmetry directions. Bridge legs can consist of arrays of sense elements, each element reversed sequentially, if required.

Further yet, the present inventor has recognized, among other things, a dynamic barber pole angle for an AMR sensor. An AMR bridge can be built directly on a semiconductor substrate where doping profiles and logic are enabled to create high conductivity regions below the ferromagnetic sense elements. The high conductivity regions can be reconfigured so that the preferential current flow angle through the ferromagnetic film is varied. The ferromagnetic sense element shape can be circular, square, cross, or long with a high aspect ratio and specific end tapers to minimize magnetic domain formation in the ends. In an example, the tapers can take an eye-like shape to a pointed end so the magnetization at the ends does not abruptly switch between orientations, creating magnetization fluxuation noise. As the current flow direction between two contacts is varied, double sampling or phase and amplitude tracking of an output signal may take place for an accurate determination of the magnetic field strength.

For elements of a size greater than a few microns in size, the system may also consist of shaped magnetic material with shorting bars, rods or circles of various geometrical configurations so that the current flow direction through the device is dependent upon the regions at which a bias voltage is applied.

In an example embodiment, current flow may proceed from the upper right to lower left for one bias configuration, resulting in a particular sensor output which is dependent upon the current flow direction with respect to the magnetization. For bias applied across a different set of contacts, the current may flow from the top to the bottom of the sense element, resulting in different angular field response. In such a case, two different in-plane responses can be achieved from a single sense element, for example, an AMR angle sensor operating in saturation mode will provide a signal related to the projection of the total magnetic field along one axes in the first current flow orientation and along an orthogonal axis in the second current flow orientation.

Figure 14A:
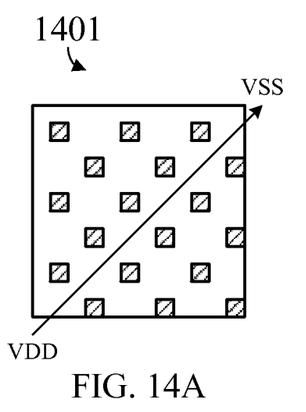
FIGS. 14A-14C illustrate generally example in-plane responses.
Figure 14B:
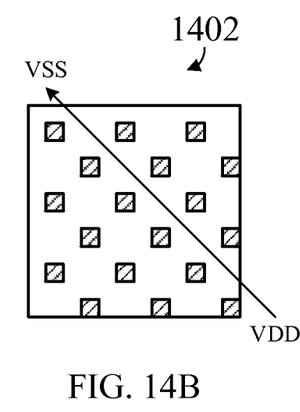
Figure 14C:
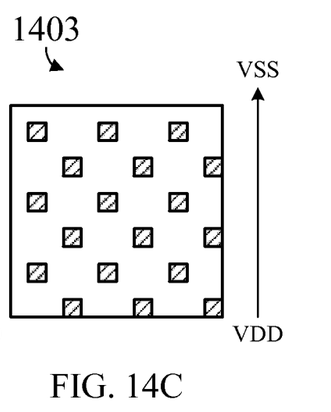

FIGS. 14A-14C illustrate generally example in-plane responses 1401, 1402, and 1403. In FIG. 14A, at time 1, the net current direction flows from VDD to VSS, and the signal is proportional to the +X field. In FIG. 14B, at time 2, the net current direction flows from VDD to VSS, and the signal is proportional to the −X field. In FIG. 14C, at time 3, the net current direction flows from VDD to VSS, and the signal is proportional to the Y field.

Further yet, the present inventor has recognized, among other things, an AMR-based system with enhanced linear range. For example, an AMR-based system can be constructed with the response layer ferromagnetically or anti-ferromagnetically coupled to another ferromagnetic layer through a non-magnetic-spacer layer, such as ruthenium (Ru), Cu, or one or more other element that exhibits ferromagnetic or antiferromagnetic exchange coupling, to enhance the linear range. The resulting system can have a larger linear range, but lower sensitivity. The competing GMR effects can be reduced by keeping the coupling film very thin (e.g., less than $\frac{1}{10}$th and preferably less than $\frac{1}{100}$th of the thickness of the AMR ferromagnetic layer). Additionally a high resistance coupling layer is utilized so that the majority of the current flow is in the thicker ferromagnetic AMR layer.

In another embodiment, the AMR film can also be weakly pinned through coupling to an amorphous fluoroplastics (AF) material such as PtMn, wherein the weak pinning results from either a thin PtMn thickness or the presence of a non-magnetic spacer layer between the pinning layer and the ferromagnetic measurement layer. This weak magnetic pinning will also cause the coupled AMR film to return to a known magnetic configuration, removing the need for reset lines to return the magnetization to a known magnetic state for lower accuracy measurement needs, such as where flipping is not required to reduce offset or offset temperature coefficient as desired for high precision sensing applications. Hence, the sensor design may be simplified.

Additional Notes and Examples

A system or apparatus can include, or can optionally be combined with any portion or combination of any portions of any one or more of the examples or illustrations above to include, means for performing any one or more of the functions described above, or a machine-readable medium including instructions that, when performed by a machine, cause the machine to perform any one or more of the functions described above.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventor also contemplates examples in which only those elements shown or described are provided. Moreover, the present inventor also contemplates examples using any combination or permutation of those elements shown or described (or one or more aspects thereof), either with respect to a particular example (or one or more aspects thereof), or with respect to other examples (or one or more aspects thereof) shown or described herein.

All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document, for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A system comprising:
a first material providing a first surface; and
a first magnetic sensor configured to sense first and second components of a magnetic field in respective, orthogonal directions, the first component in one of an X direction or a Y direction parallel to the first surface, and the second component in a Z direction orthogonal to the first surface,
wherein the first magnetic sensor includes first, second, third, and fourth sense elements, each on an angled surface sloped with respect to the first surface, wherein the first, second, third, and fourth sense elements of the first magnetic sensor include respective first, second, third, and fourth longitudinal axes, each parallel to each other, and
wherein each of the first, second, third, and fourth sense elements of the first magnetic sensor include a plurality of bias elements disposed on a surface of a respective sense element longitudinally at a 45-degree angle with respect to the longitudinal axis of the respective sense element to deflect magnetization from the longitudinal axis of the respective sense element.

2. The system of claim 1, including:
a second magnetic sensor configured to sense the second component of the magnetic field and a third component of the magnetic field in respective, orthogonal directions, the second component in the Z direction orthogonal to the first surface, and the third component in one of the X direction or the Y direction parallel to the first surface and orthogonal to the first component,
wherein the second magnetic sensor includes first, second, third, and fourth sense elements, each on an angled surface sloped with respect to the first surface, wherein the first, second, third, and fourth sense elements of the second magnetic sensor include respective first, second, third, and fourth longitudinal axes, each parallel to each other, wherein the longitudinal axes of the second magnetic sensor are orthogonal to the longitudinal axes of the first magnetic sensor.

3. The system of claim 2, wherein the first component of the magnetic field is in the Y direction, parallel to the first surface, wherein the second component of the magnetic field is the Z direction, orthogonal to the first surface, and wherein the third component of the magnetic field is in the X direction, parallel to the first surface and orthogonal to the Y direction.

4. The system of claim 2, including:
a first reset line having a longitudinal axis parallel to the longitudinal axes of the first magnetic sensor; and
a second reset line having a longitudinal axis parallel to the longitudinal axes of the second magnetic sensor.

5. The system of claim 1, wherein the first material includes a substrate including first, second, third, and fourth angled surfaces, wherein the first, second, third, and fourth sense elements of the first magnetic sensor are formed on the respective first, second, third, and fourth angled surfaces.

6. The system of claim 1, including a first reset line having a longitudinal axis parallel to the longitudinal axis of the first sense element and configured to provide a field along the longitudinal axis of the first sense element.

7. The system of claim 6, wherein the first material includes a dielectric material including first, second, third, and fourth angled surfaces, wherein the first, second, third, and fourth sense elements of the first magnetic sensor are formed on the respective first, second, third, and fourth angled surfaces, wherein the system further includes a second reset line having a longitudinal axis parallel to the longitudinal axis of the first sense element and configured to provide a field along the longitudinal axis of the first sense element, and wherein the first sense element is between the first and second reset lines.

8. The system of claim 1, wherein the first component of the magnetic field is in the Y direction, parallel to the first surface, and wherein the second component of the magnetic field is in the Z direction, orthogonal to the first surface.

9. The system of claim 1,
wherein the plurality of bias elements disposed on the first sense element of the first magnetic sensor are parallel to each other, and
wherein the plurality of bias elements disposed on the second sense element of the first magnetic sensor are parallel to each other and form a 90degree angles with respect to the plurality of bias elements disposed on the first sense element.

10. The system of claim 1, wherein the first, second, third, and fourth sense elements of the first magnetic sensor include ferromagnetic sense elements.

11. A method, comprising:
sensing first and second components of a magnetic field in respective, orthogonal directions, the first component in one of an X direction or a Y direction parallel to the first surface, and the second component in a Z direction orthogonal to the first surface,
wherein sensing the first and second components includes using a first magnetic sensor including first, second, third, and fourth sense elements, each on an angled surface sloped with respect to a first surface of a first material, wherein the first, second, third, and fourth sense elements of the first magnetic sensor include respective first, second, third, and fourth longitudinal axes, each parallel to each other, and
biasing each respective sense element of the first, second, third, and fourth sense elements of the first magnetic sensor using separate pluralities of bias elements disposed on a surface of each of the first, second, third, and fourth sense elements longitudinally at a 45-degree angle with respect to the longitudinal axis of the respective sense element to deflect magnetization from the longitudinal axis of the respective sense element.

12. The method of claim 11, including:
sensing the second component of the magnetic field and a third component of the magnetic field in respective, orthogonal directions using a second magnetic sensor, the second component in the Z direction orthogonal to the first surface, and the third component in one of the X direction or the Y direction parallel to the first surface and orthogonal to the first component,
wherein the second magnetic sensor includes first, second, third, and fourth sense elements, each on an angled surface sloped with respect to the first surface, wherein the first, second, third, and fourth sense elements of the second magnetic sensor include respective first, second, third, and fourth longitudinal axes, each parallel to each other, and wherein the longitudinal axes of the second magnetic sensor are orthogonal to the longitudinal axes of the first magnetic sensor.

13. The method of claim 12, wherein sensing the first component of the magnetic field includes sensing a component of the magnetic field in the Y direction, parallel to the first surface, wherein the sensing the second component of the magnetic field includes sensing a component of the magnetic field in the Z direction, orthogonal to the first surface, and wherein the sensing the third component of the magnetic field includes sensing a component of the magnetic field in the X direction, parallel to the first surface and orthogonal to the Y direction.

14. The method of claim 11, wherein the first material includes a substrate including first, second, third, and fourth angled surfaces, wherein the first, second, third, and fourth sense elements of the first magnetic sensor are formed on the respective first, second, third, and fourth angled surfaces.

15. The method of claim 11, including:
providing a field along the longitudinal axis of the first sense element using a first reset line having a longitudinal axis parallel to the longitudinal axis of the first sense element.

16. The method of claim 11, including:
providing a field along the longitudinal axis of the first sense element using first and second reset lines, each having a longitudinal axis parallel to the longitudinal axis of the first element, wherein the first sense element is between the first and second reset lines.

17. The method of claim 11, wherein sensing the first component of the magnetic field includes sensing a component of the magnetic field in the Y direction, parallel to the first surface, and wherein the sensing the second component of the magnetic field includes sensing a component of the magnetic field in the Z direction, orthogonal to the first surface.

18. The method of claim 11, including:
biasing the first sense element using a first plurality of bias elements disposed on the first sense element of the first magnetic sensor at 45-degree angles with respect to the longitudinal axis of the first sense element, wherein the first plurality of bias elements are parallel to each other.

19. The method of claim 18, including:
biasing the second sense element using a second plurality of bias elements disposed on the second sense element of the first magnetic sensor at 45-degree angles with respect to the longitudinal axis of the first sense element, wherein the second plurality of bias elements are parallel to each other and form a 90degree angles with respect to the first plurality of bias elements.

20. A system comprising:
a first material providing a first surface;
a first magnetic sensor configured to sense first and second components of a magnetic field in respective, orthogonal directions; and
a second magnetic sensor configured to sense the second component of the magnetic field and a third component of the magnetic field in respective, orthogonal directions,
wherein the first component of the magnetic field is in a Y direction parallel to the first surface, the second component of the magnetic field in a Z direction orthogonal to the first surface, and the third component of the magnetic field in an X direction parallel to the first surface and orthogonal to the Y direction, wherein the first magnetic sensor includes first, second, third, and fourth sense elements, each on an angled surface sloped with respect to the first surface, wherein the first, second, third, and fourth sense elements include respective first, second, third, and fourth longitudinal axes, each parallel to each other, wherein the second magnetic sensor includes first, second, third, and fourth sense elements, each on an angled surface sloped with respect to the first surface, wherein the first, second, third, and fourth sense elements include respective first, second, third, and fourth longitudinal axes, each parallel to each other, and wherein the longitudinal axes of the second magnetic sensor are orthogonal to the longitudinal axes of the first magnetic sensor.

* * * * *